United States Patent
Söderbärg et al.

(10) Patent No.: US 6,686,233 B2
(45) Date of Patent: Feb. 3, 2004

(54) INTEGRATION OF HIGH VOLTAGE SELF-ALIGNED MOS COMPONENTS

(75) Inventors: Anders Söderbärg, Norrtälje (SE); Peter Olofsson, Stenhamra (SE); Andrej Litwin, Danderyd (SE)

(73) Assignee: Telefonaktiebolaget LM Ericsson, Stockholm (SE)

( * ) Notice: Subject to any disclaimer, the term of this patent is extended or adjusted under 35 U.S.C. 154(b) by 69 days.

(21) Appl. No.: 09/985,447

(22) Filed: Nov. 2, 2001

(65) Prior Publication Data

US 2002/0055220 A1 May 9, 2002

(30) Foreign Application Priority Data

Nov. 3, 2000 (SE) .............................. 0004027

(51) Int. Cl.[7] ................. H01L 21/8238; H01L 21/8249; H01L 21/425
(52) U.S. Cl. ................. 438/217; 438/199; 438/202; 438/217; 438/225; 438/229; 438/232; 438/236; 438/525
(58) Field of Search ................. 438/200, 217, 438/218, 221, 225, 227, 232, 289, 290, 291, 525

(56) References Cited

U.S. PATENT DOCUMENTS

| | | | |
|---|---|---|---|
| 5,047,358 A | 9/1991 | Kosiak et al. | |
| 5,061,975 A | 10/1991 | Inuishi et al. | |
| 5,498,554 A | * 3/1996 | Mei | ............... 438/200 |
| 5,532,176 A | 7/1996 | Katada et al. | |
| 5,705,410 A | 1/1998 | Guegan | |
| 5,891,782 A | 4/1999 | Hsu et al. | |
| 5,905,284 A | * 5/1999 | Fujii et al. | ............... 257/335 |
| 6,451,640 B1 | * 9/2002 | Ichikawa | ............... 438/199 |

FOREIGN PATENT DOCUMENTS

WO    WO 95/26045    9/1995

OTHER PUBLICATIONS

Wolf et al., Silicon Processing for the VLSI Era (2000), Lattice Press, Second Edition, volumne 1, p. 301.*
H. Ballan et al.: "High voltage devices and circuits in standard CMOS technologies", Kluwer Academic Publishers, 1999, pp. 78–91.

* cited by examiner

Primary Examiner—Carl Whitehead, Jr.
Assistant Examiner—David L. Hogans
(74) Attorney, Agent, or Firm—Burns, Doane, Swecker & Mathis, L.L.P.

(57) ABSTRACT

The invention relates to a method for forming a high voltage NMOS transistor together with a low voltage NMOS transistor and a low voltage PMOS transistor, respectively, in an n-well CMOS process by adding solely two additional process steps to a conventional CMOS process: (i) a masking step, and (ii) an ion implantation step for forming a doped channel region for the high voltage MOS transistor in the substrate self-aligned to the edge of the high voltage MOS transistor gate region. The ion implantation is performed through the mask in a direction, which is inclined at an angle to the normal of the substrate surface, to thereby create the doped channel region partly underneath the gate region of the high voltage MOS transistor.

29 Claims, 5 Drawing Sheets

INTEGRATION OF HIGH VOLTAGE SELF-ALIGNED MOS COMPONENTS

This application claims priority under 35 U.S.C. §§119 and/or 365 to 0004027-9 filed in Sweden on Nov. 3, 2000; the entire content of which is hereby incorporated by reference.

TECHNICAL FIELD

The present invention generally relates to a CMOS process and more specifically to a method of fabricating a high voltage self-aligned MOS transistor in a low voltage CMOS process, and to a semiconductor structure comprising such a high voltage self-aligned MOS transistor integrated with low voltage CMOS components.

TECHNICAL BACKGROUND

In modern low voltage CMOS processes the line widths, distances and layer thicknesses are more and more reduced in order to increase the speed and decrease the size of the components in the CMOS circuit.

As a result of this also feed voltages and signal voltages are reduced. For digital components this is a benefit since it saves electrical power. In analog applications, such as e.g. mixed signal and radio frequency (RF) applications, however, a voltage dynamics may be needed which is not possible to obtain using such a low voltage CMOS process.

If additional process steps were added to a conventional low voltage CMOS process, it would be possible to fabricate low voltage and high voltage transistors on the same chip in a BiCMOS process, but such process would be more complicated and thus more costly compared to conventional CMOS manufacturing technology.

Another solution would be to employ a dual gate CMOS process, which includes the fabrication of CMOS devices with two different gate oxides. A component having a thicker gate oxide would be able to handle the higher voltage. Such process is also more complicated and furthermore, it may be difficult to achieve sufficiently good performance e.g. in radio frequency applications using such kind of MOS devices because such thicker gate oxide deteriorates the performance at high frequency.

Still a further way to incorporate fabrication of high voltage components into a low voltage CMOS process is described in H. Ballan et al. "High voltage devices and circuits in standard CMOS technologies", Kluwer Academic Publishers, 1999, pages 78–79, and uses a LOCOS oxide inside the high voltage component to increase its breakdown voltage. The channel area and its length are defined before the depositing and etching of the polysilicon. A drawback of such an approach is that the channel is not self-aligned.

Further, lateral self-aligned DMOS structures have been integrated in the CMOS process flow but the channel area has been diffused from the edge of e.g. the gate structure. Such a provision needs an additional annealing step, which may not always be desirable since the thermal budget in many processes is very limited. Furthermore, an optimal doping gradient in the channel area is not obtained since the highest channel doping is automatically obtained closest to the source area.

U.S. Pat. No. 5,891,782 issued to S. T. Hsu et al. and WO95/26045 (A. Söderbärg et al.) disclose methods for forming channel areas by means of an inclined implantation. However, the resulting structures are not capable of allowing high voltages to be applied between the drain and the gate and such limitation is not acceptable in many applications. Further, the designs are very dependent on how the transistor structures are oriented on the substrate, which further complicates the fabrication processes.

SUMMARY OF THE INVENTION

It is consequently an object of the present invention to provide, in a CMOS process, a method for forming a high voltage MOS transistor together with a low voltage NMOS transistor and a low voltage PMOS transistor, respectively, while overcoming at least some of the problems associated with the prior art.

It is a further object of the present invention to provide such method which is capable of fabricating a high voltage MOS transistor which possesses very good performance as regards e.g. breakthrough voltages and noise levels.

It is still a further object of the invention to provide such method which is capable of fabricating integrated circuits for digital and analog radio frequency (RF) applications.

It is yet a further object of the invention to provide such method which is easy to perform and which provides for high fabrication yields.

It is in this respect a particular object of the invention to provide such method that adds a minimum of additional process steps to a conventional low voltage CMOS process.

These objects among others are, according to one aspect of the invention, fulfilled by a method wherein a semiconductor substrate is provided; n-well regions for the high voltage NMOS transistor and the low voltage PMOS transistor are formed in the substrate by means of ion implantation; a p-well region for the low voltage NMOS transistor is formed in the substrate by means of ion implantation; and isolation areas are formed on top of and/or in the substrate to laterally separate the transistor from each other and to define a voltage distributing region in the high voltage NMOS transistor. The isolation areas are typically LOCOS or shallow trench isolation (STI). Further gate regions for the high voltage NMOS transistor and the low voltage NMOS and PMOS transistors, respectively, are produced by forming a respective thin gate oxide on the substrate; depositing a conducting or semiconducting layer thereon; and patterning said layer to form the respective gate regions. The gate region for the high voltage NMOS transistor is here formed partly above the isolation area defining the voltage distributing region.

Subsequently thereto, a p-doped channel region for the high voltage NMOS transistor is formed in the substrate self-aligned to the edge of the high voltage NMOS transistor gate region. According to the present invention this p-doped channel region is formed by ion implantation through a mask, where the ion implantation is effectuated in a direction, which is inclined at an angle to the normal of the substrate surface, to thereby create the channel region partly underneath the gate region of the high voltage NMOS transistor.

Finally, drain and source regions for the low voltage PMOS transistor are formed by means of creating ion implanted $p^+$-regions; and drain and source regions for the high voltage and low voltage NMOS transistors are formed by means of creating ion implanted $n^+$ regions, wherein the source region for the high voltage NMOS transistor is created within the p-doped channel region.

According to a further aspect of the invention a corresponding method for forming a high voltage PMOS transistor together with a low voltage NMOS transistor and a low voltage PMOS transistor on a chip is provided.

According to yet a further aspect of the invention a method for forming a high voltage NMOS transistor together with a low voltage NMOS transistor in a MOS process (e.g. CMOS, BiCMOS, or NMOS process) comprising the steps of providing a semiconductor substrate; forming n-well regions for the high voltage NMOS transistor in the substrate by means of ion implantation; forming a p-well region for the low voltage NMOS transistor in the substrate by means of ion implantation; forming isolation areas on top of and/or in the substrate to laterally separate the transistors from each other and to define a voltage distributing region in the high voltage NMOS transistor; producing gate regions for the high voltage NMOS transistor and the low voltage NMOS transistors, respectively, by forming a respective thin gate oxide on the substrate; depositing a layer of a conducting or semiconducting material thereon; and patterning said layer to form the respective gate regions, whereby the gate region for the high voltage NMOS transistor is formed partly above the isolation area defining the voltage distributing region; forming a p-doped channel region for the high voltage NMOS transistor in the substrate self-aligned to the edge of the high voltage NMOS transistor gate region; and forming source and drain regions for the high voltage and low voltage NMOS transistors by means of creating ion implanted $n^+$ regions, wherein the source region for the high voltage NMOS transistor is created within the p-doped channel region. According to the invention, the step of forming a p-doped channel region for the high voltage NMOS transistor in the substrate self-aligned to the edge of the high voltage NMOS transistor gate region is performed by ion implantation through a mask, said ion implantation being effectuated in a direction, which is inclined at an angle to the normal of the substrate surface, to thereby create said p-doped channel region partly underneath the gate region of the high voltage NMOS transistor.

An advantage of the present invention is that improved high voltage and low voltage components can be integrated into a single MOS process through the sole adding of a mask step and an ion implantation step.

Further, the channel length is very well defined by forming the channel region by means of ion implantation only.

By performing the inclined implantation in a plurality of different directions, e.g. four, the orientation of the high voltage NMOS transistor on the chip is not crucial.

Further advantages and characteristics of the present invention will be disclosed in the following detailed description of embodiments.

BRIEF DESCRIPTION OF DRAWINGS

The present invention will become more fully understood from the detailed description of embodiments of the present invention given hereinbelow and the accompanying FIGS. 1–13 which are given by way of illustration only, and thus are not limitative of the invention.

DETAILED DESCRIPTION OF PREFERRED EMBODIMENTS

In the following description, for purposes of explanation and not limitation, specific details are set forth, such as particular processes, techniques, etc. in order to provide a thorough understanding of the present invention. However, it will be apparent to one skilled in the art that the present invention may be practiced in other embodiments that depart from these specific details. In other instances, detailed descriptions of well-known processes, methods, and techniques are omitted so as not to obscure the description of the present invention with unnecessary details.

With reference to accompanying FIGS. 1–12 a first inventive embodiment of an n-well CMOS process, which includes formation of a high voltage NMOS (HVNMOS) transistor together with a low voltage NMOS (LVNMOS) transistor and a low voltage PMOS (LVPMOS) transistor, respectively, is described schematically.

The starting material of a standard n-well CMOS process is a high resistivity p-type substrate 1. The total number of processing steps of an entire silicon wafer is numerous, but actually, these can be summarized to the schematic modules depicted herein. The technology considered here is a n-well CMOS process with a single polysilicon layer and two metal layers. The basic process requires twelve masks to implement the complementary devices and one additional mask to integrate the formation of a high voltage NMOS transistor into the flow. Further options are available to implement other analog features, however, such options are not discussed further here.

Figure 1:
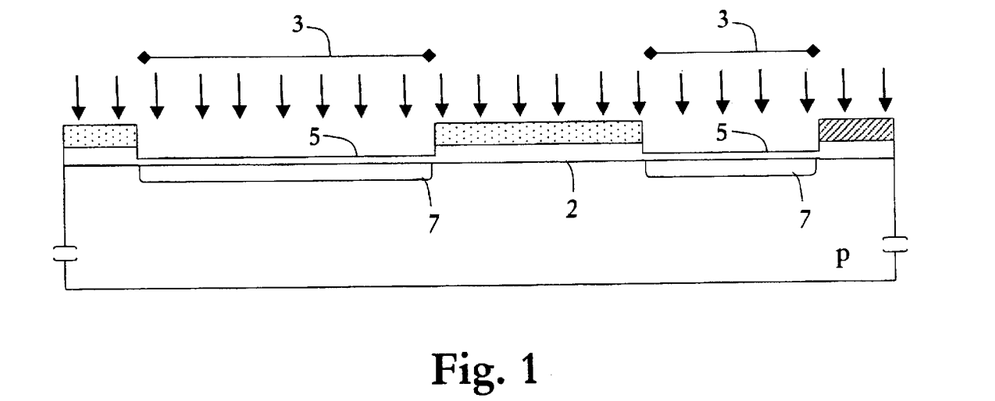
FIGS. 1–12 are enlarged schematic cross-sectional views of a portion of a semiconductor structure at various steps of processing according to a first embodiment of the present invention.

The n-well implant phase starts with the growth of an oxide 2 followed by a mask 3 delimiting the n-well location. The oxide is etched at this location where the photoresist has been previously removed. After the etching of the oxide, a thin buffer oxide 5 is grown to protect the surface of the silicon, and a phosphorus implant 7 is performed, as shown in FIG. 1.

Figure 2:
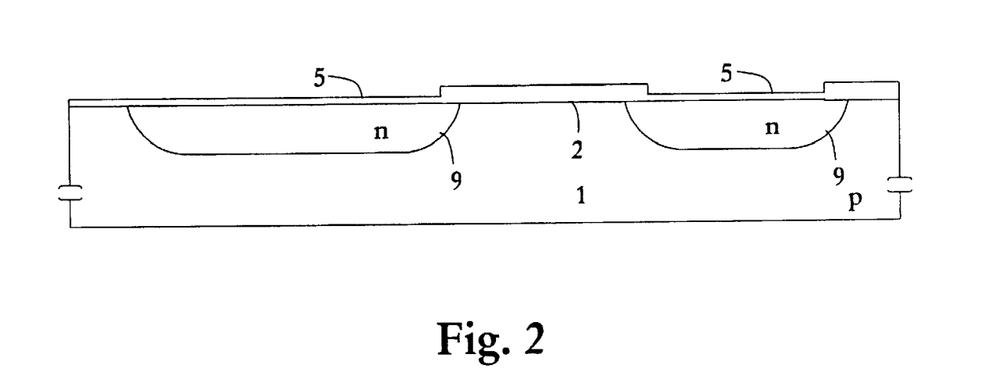

Then, a diffusion phase of the phosphorus is performed to achieve resulting n-wells 9 as seen in FIG. 2. The diffusion is typically performed in two steps; first in a non oxidizing atmosphere such as e.g. $N_2$, followed by a diffusion phase in dry $O_2$ atmosphere, to increase the n-well depth.

Figure 3:
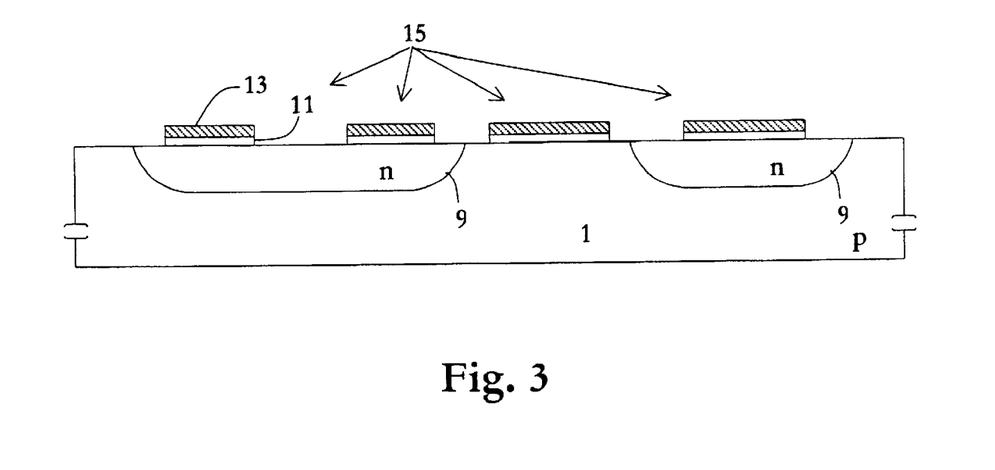

After the diffusion phase of the n-well, the initial oxide is completely etched and a new thin oxide layer 11 is grown in a dry $O_2$ atmosphere. An initial nitride layer 13 is then deposited, and the active areas 15 are delimited by a corresponding mask (not illustrated). Thus, the nitride is removed outside these areas and, in a final step, the photoresist is completely removed. The resulting structure is illustrated in FIG. 3.

Figure 4:
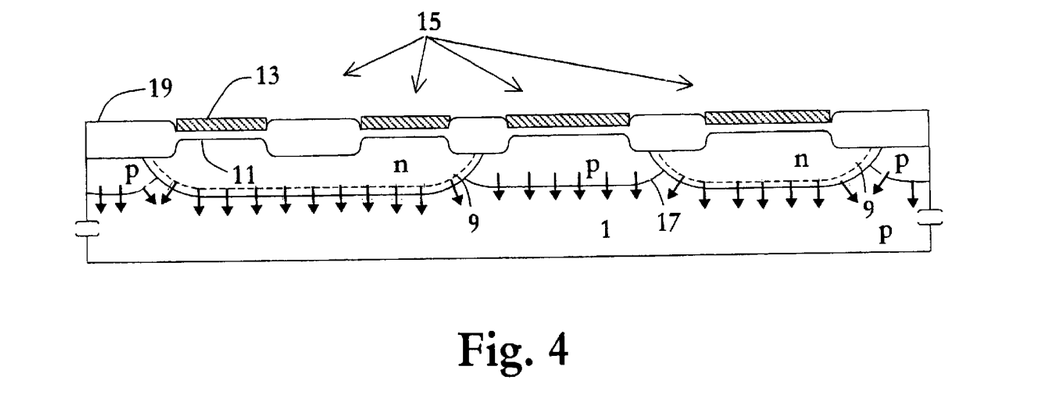

The isolation between the complementary low voltage MOS transistors and between them and the high voltage NMOS transistor uses a field doping mask and two different p-type implants. Thus, the photoresist is first etched outside the mask region, then a "channel stop" implant is performed using boron. This step is followed by a second high energy boron implant dose, called a p-well implant 17. Note that the nitride 13, where the photoresist has been removed, is not totally opaque to the second high energy implant, as shown in FIG. 4. In this region, the boron concentration typically reaches a peak of about $2.5 \times 10^{16}$ $cm^{-3}$ at 0.4 $\mu m$ depth.

Figure 5:
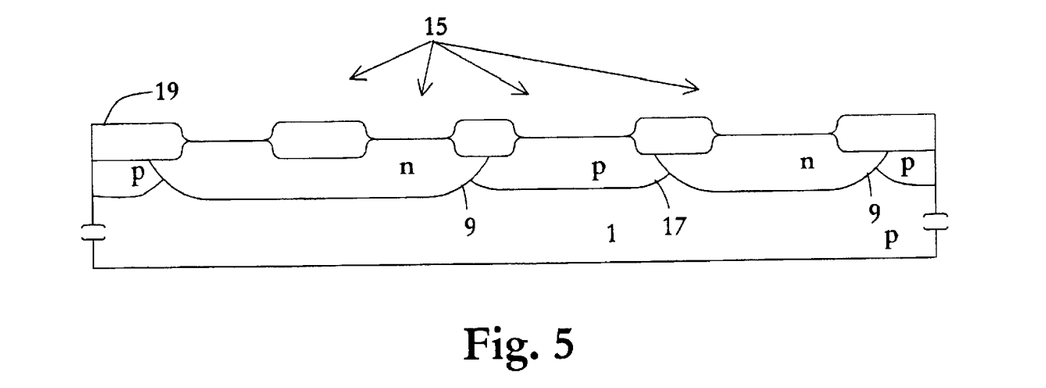

Once the isolation is achieved, the remaining photoresist is removed, but the nitride 13 is kept during the growth of a 10000 Å field-oxide (LOCOS) 19. The growth is typically performed in two steps, the first being in an $N_2$ atmosphere, and the second in a wet $H_2O$ atmosphere. The resulting field-oxide shape is shown in FIG. 5. Note that a field oxide is grown also within the left one of the n-wells 9, which is to be used as a voltage distributing region in the high voltage NMOS transistor.

It shall be appreciated that the isolation may equally well be implemented as shallow trench isolation (STI). It is thus obvious to a man skilled in the art to change currently described process to incorporate shallow trench isolation areas instead of LOCOS isolation.

As a further alternative the isolation area used as a voltage distributing region within the high voltage NMOS transistor may be a low doped n⁻ region, while the isolation areas separating the transistors may be a LOCOS oxide or STI areas.

It shall further be appreciated that the order in which the n-well, p-well, and lateral isolation areas is formed is not crucial as long as a resulting structure is obtained having n- and p-wells separated by isolation areas.

After the field-oxide growth, the initial nitride layer is removed and the buffer oxide is etched, see FIG. 5. Note that during the thermal oxidation, the n-well depth increases of about 1 μm and the peak of the boron concentration of the p-well and "channel stop" implants is typically reduced to $10^{16}$ cm$^{-3}$ over 1–2 μm depth.

Figure 6:
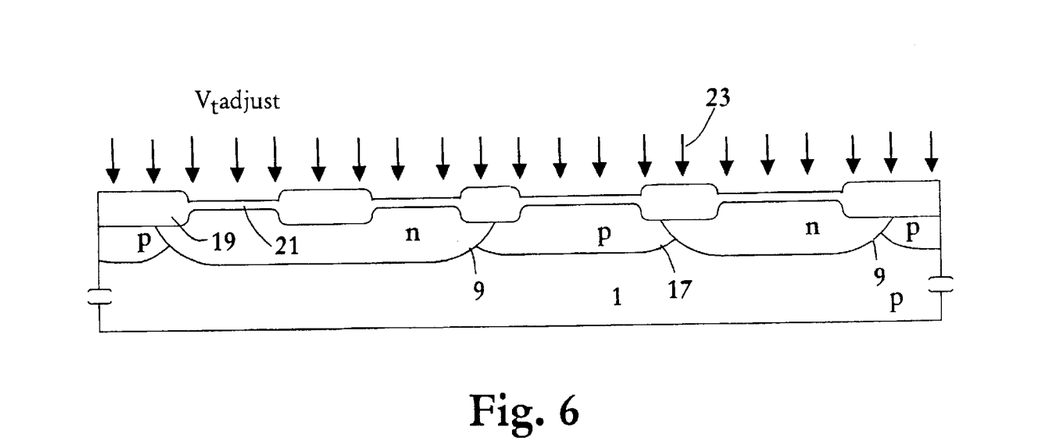

After the field-oxide growth, the next steps consist of growing and depositing the gate oxide and polysilicon gate respectively. A thin gate oxide 21 is grown in a dry $O_2$ atmosphere. When the gate oxide growth is achieved, a low energy boron implant 23 is performed to adjust the threshold voltage of the devices. It is obvious that this low energy implant is stopped by the field-oxide, localizing the $V_t$ adjust under the gate oxide regions only as shown in FIG. 6. Alternatively, the $V_t$ adjust is achieved by using two separate mask and implantation steps (for NMOS and PMOS, respectively). Such alternative approach provides for a larger flexibility at the optimization of the process.

Figure 7:
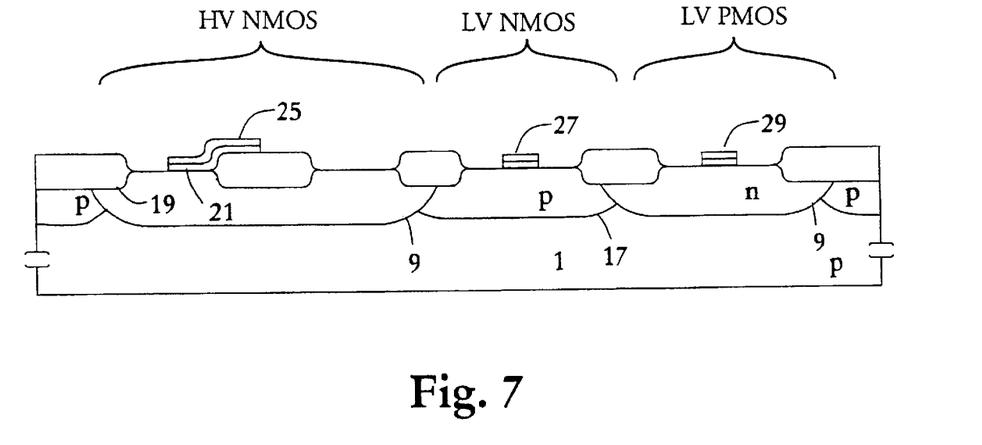

This step is followed by a 2000–4000 Å polysilicon layer deposition and doping. The gates are defined by the corresponding mask, which allows the etching of the polysilicon layer. Finally, the photoresist is removed and the gate oxide is etched outside the polysilicon gate areas. The structure thus received is illustrated in FIG. 7. Here, 25 denotes the gate polysilicon for the high voltage NMOS transistor, 27 denotes the gate polysilicon for the low voltage NMOS transistor, and 29 denotes the gate polysilicon for the low voltage PMOS transistor.

It shall be appreciated that layers of other material than polysilicon may be employed for the gate structure.

Figure 8:
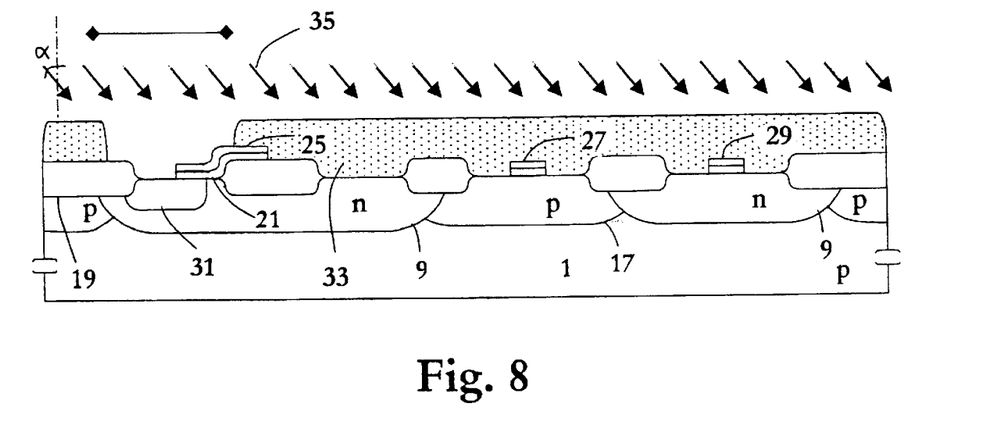

The next step is to form a p-doped channel region 31 for the high voltage NMOS transistor in the substrate self-aligned to the edge of the high voltage NMOS transistor gate region. According to the present invention, a mask 33 is placed above the structure to protect i.a. the drain areas for the respective transistor, this mask step being followed by ion implantation 35 of boron, or other p-type dopant such as $BF_2$, $BF_3$ or aluminium, or indium. The implantation 35 is performed in a direction, which is inclined at an angle α to the normal of the substrate surface, as illustrated in FIG. 8. In such manner the p-doped channel region 31 is formed partly underneath the gate region 25 of the high voltage NMOS transistor without the use of a diffusion step.

An optimal dope profile ought to be homogenous or even better having the highest doping concentration closest to the drain area in order to exhibit good AC performance and lower the noise level. Thus, preferably $10^{12}$–$10^{15}$ cm$^{-2}$ of boron (or other p-type dopant) is implanted at an energy of 10–300 keV. The angle α with which the implantation direction is altered from normal incidence may range from 15° to 75°.

In the case of high energy implantation is performed there may be a risk that the dopants are penetrating through the gate polysilicon layer 25. To reduce such risk the polysilicon mask may be left on top of the polysilicon and the implantation mask would then be arranged on top of the polysilicon mask, whereafter the implantation would be performed through the two masks (not illustrated). Subsequent thereto the two masks would be removed simultaneously.

Alternatively, or additionally, the gate polysilicon layer may be formed thicker than conventionally such that dopant penetration through the polysilicon can be prevented or at least reduced. In such instance the gate polysilicon thickness would be dependent on the ion implantation energy.

A third alternative (not illustrated) would be to form a multilayer gate structure including i.a. a polysilicon layer and a layer of a material having high etch selectivity with respect to polysilicon thereon. The gate structure can then be defined in a similar way as described above, whereafter the gate mask is removed. The mask for the channel implantation is then placed above the structure and the implantation is effectuated. The multilayer gate structure will effectively hinder any ions to penetrate the gate structure during implantation. Subsequently, the implantation mask and optionally the additional gate structure layer of the material having the high etch selectivity are removed. This latter material may be deposited oxide containing phosphorus (such material has high etch selectivity with respect to both polysilicon and undoped oxide).

By forming the p-doped channel region 31 by inclined ion implantation 33 an accurate and precise definition of the channel region may be performed whereby the breakdown voltage and the noise properties of the high voltage NMOS transistor may be controlled.

By providing ion implantation in plurality of directions, each of which being inclined to the normal of the substrate surface, the orientation of the high voltage component on the substrate is not needed to be known. Preferably, implantation is performed in four different directions symmetrically distributed around the normal of the substrate surface.

By such provision it is possible to fabricate a plurality of the above described high voltage NMOS transistor differently oriented on a single chip. This lessens the demands on the integrated circuit design considerably.

Figure 9:
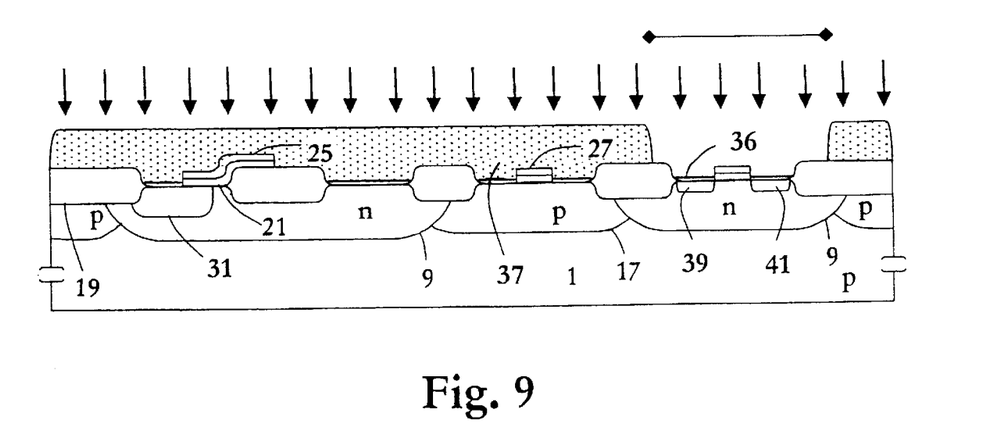
Figure 10:
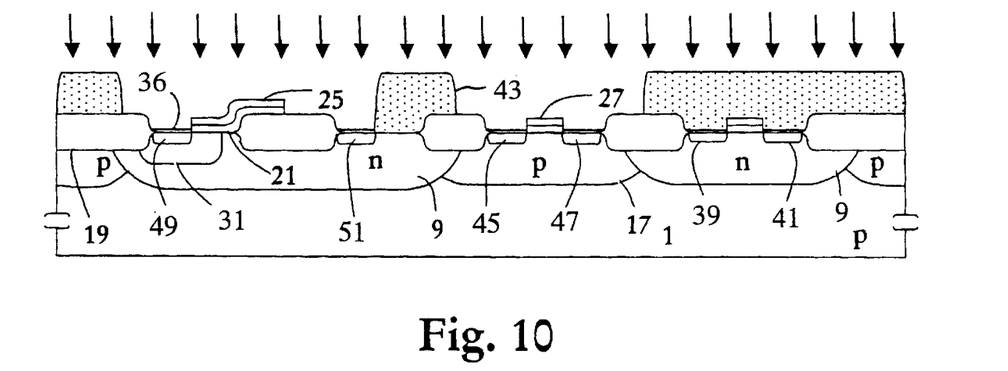

Next, the formation of the source and drain regions is to be performed. The following steps, illustrated in FIGS. 9 and 10, are thus associated with the implantation of the source and drain diffusions.

First, a spacer oxide 36 or nitride is formed. After the definition of the implant mask 37 of the p⁺ diffusion boron is implanted. Thus, p⁺ doped source 39 and drain 41 regions for the low voltage PMOS transistor are obtained. The photoresist is then removed and the mask 43 of the n⁺ diffusion implant is defined. Phosphorus (or As or Sb) is then implanted to form n⁺ doped source 45 and drain 47 regions for the low voltage NMOS transistor and source 49 and drain 51 regions for the high voltage NMOS transistor.

Figure 11:
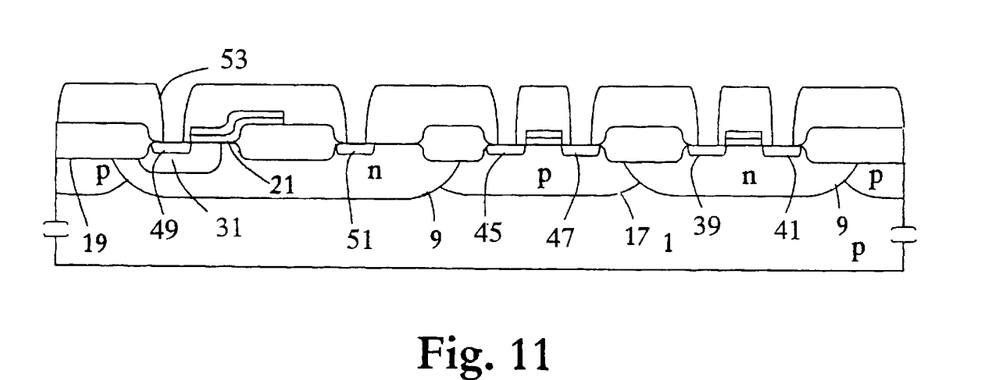

After the drain and source implant steps, the photoresist is completely removed and a first $SiO_2$ is deposited and densified. The mask of the source, drain and substrate contacts is then defined, and the etching of the oxide is performed. The result of this step is shown in FIG. 11 wherein the etched $SiO_2$ is denoted by 53.

Before the deposition of the first $SiO_2$, the source/drain and gate regions may be silicidized by means of e.g. a Salicid process (Self Aligned Silicide process), where a silicide, i.e. a metal-silicon compound (not illustrated), is formed on bare silicon and polysilicon areas. As this silicide can be self aligned by means of earlier formed spacers of oxide or nitride, the source/drain and gate resistances are minimized.

Figure 12:
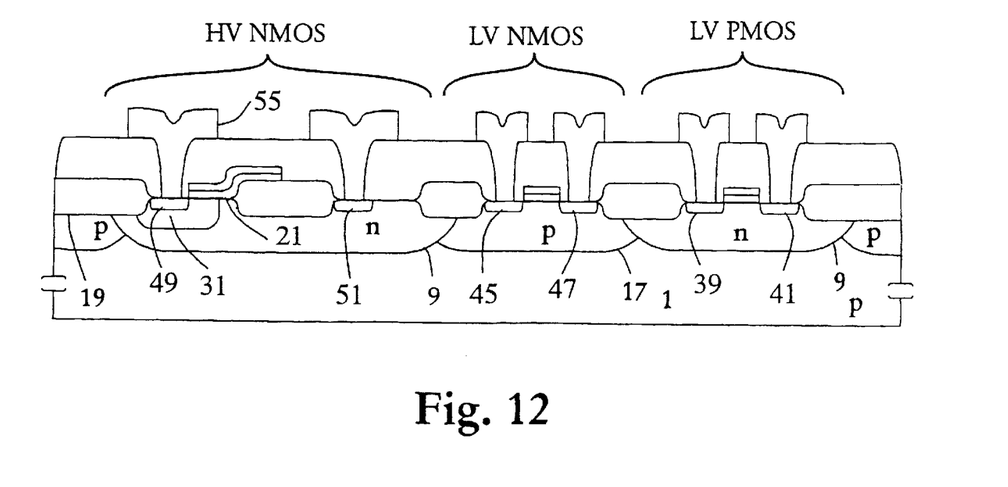

An aluminium layer deposition follows the $SiO_2$ opening, and the interconnection mask is defined for the etching of the metall layer, and the resulting structure is illustrated in FIG. 12 wherein the etched metal layer is denoted by 55. When this is achieved, the photoresist is removed for the following steps, which involves the deposition of a second metal layer (not illustrated). A second $SiO_2$ is deposited after the first metal layer deposition followed by a chemical planarization process. The via mask is then defined and the $SiO_2$ is etched at these locations. The photoresist is removed and a second aluminium layer is deposited. The etching of the second metal layer is performed using the corresponding mask, followed by a passivation layer deposition.

It shall be appreciated that the metallization may be performed in a plurality of other manners without departing from the present invention. Particularly, a multilayer metallization process may include a repeated number of oxide layer depositions; planarizations; contact etches; metal depositions; metal etches; etc.

Figure 13:
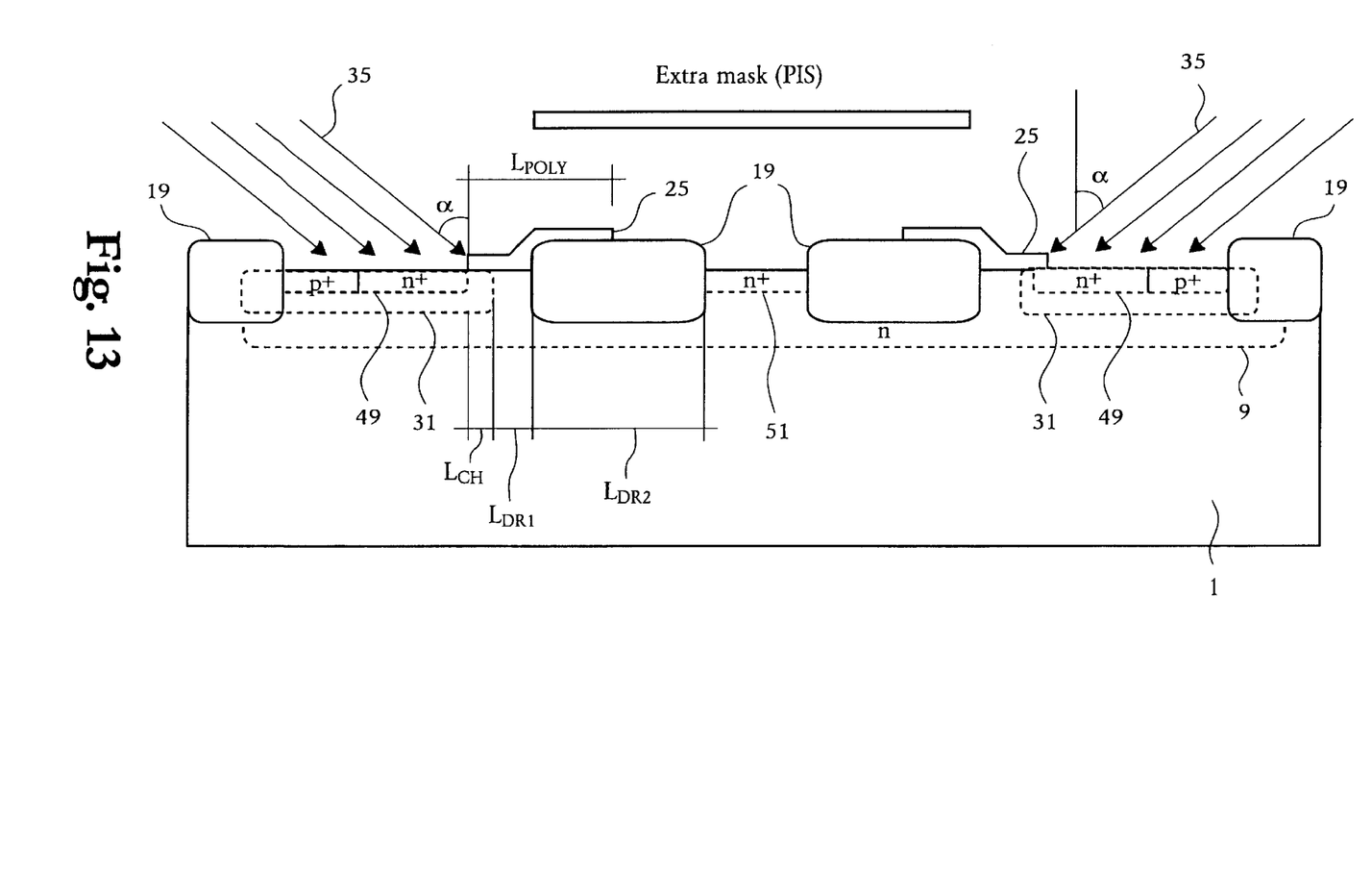
FIG. 13 is an enlarged schematic cross-sectional view of a portion of a semiconductor structure at a particular step of processing according to a second embodiment of the present invention

According to a second embodiment of the invention, as being illustrated in FIG. 13, a symmetric high voltage NMOS transistor may be fabricated in a conventional CMOS process flow by the adding of the above described masking and inclined ion implantation steps. Here, however, the ion implantation 35 has to be performed from a plurality of directions, as indicated in the Figure.

When the gate polysilicon 25 extends up over the field oxide edge (formed by means of e.g. LOCOS or STI) towards the drain region 51 and the drain region is located in the center of the structure, a very good voltage distribution may be achieved between the drain 51 and the gate 25 as well. In such a manner a high voltage component may be integrated in the process flow with a minimum number of additional process steps and at the same time obtaining possibilities to define very short channel lengths without obtaining a too large relative error in the channel length.

Also in this symmetric geometry, the isolation area 19 within the high voltage NMOS transistor may be a low doped n⁻ region instead of a LOCOS or STI region. Charge carriers in such a low doped n⁻ region will be depleted when a high voltage is applied between the drain 51 and the source 49. As a consequence of this depletion no high voltage will be obtained over the gate oxide 21. Such technique is denoted RESURF. The implantation dose for this depletion region is about $1-2\times10^{12}$ cm$^{-2}$ and the p channel region dose has of course to be higher. The RESURF technique would also be usable in a SOI structure (SOI, silicon-on-insulator).

It shall be readily appreciated that the ideas of the present invention may equally well be applied for the fabrication of a high voltage PMOS transistor in the very same process flow. Such transistor will typically have its drain short-circuit to the substrate (as a p type substrate is used in the process). To avoid such a restriction two additional process steps (one masking step and one ion implantation step) may be performed to firstly define a relatively deep n-well, whereafter a shallower p-well for the high voltage PMOS transistor is defined within the n-well. In such manner short circuit to the substrate is avoided.

It shall further be appreciated that the inventive process flow depicted may be incorporated in any BiCMOS process flow.

It will be obvious that the invention may be varied in a plurality of ways. Such variations are not to be regarded as a departure from the scope of the invention. All such modifications as would be obvious to one skilled in the art are intended to be included within the scope of the appended claims.

What is claimed is:

1. In an CMOS or BiCMOS process a method for forming a high voltage NMOS transistor together with a low voltage NMOS transistor and a low voltage PMOS transistor, respectively, comprising the steps of:

providing a semiconductor substrate;

forming n-well regions for the high voltage NMOS transistor and the low voltage PMOS transistor in the substrate by means of ion implantation;

forming a p-well region for the low voltage NMOS transistor in the substrate by means of ion implantation;

forming isolation areas on top of an/or in the substrate to laterally separate the transistors from each other and to define a voltage-distributing region in the high voltage NMOS transistor;

producing gate regions for the high voltage NMOS transistor and the low voltage NMOS and PMOS transistors, respectively, by forming a respective thin gate oxide on the substrate; depositing a layer of a conducting or semiconducting material thereon; and patterning said layer to form the respective gate regions, whereby the gate region for the high voltage NMOS transistor is formed partly above the isolation area defining the voltage distributing region;

forming a p-doped channel region for the high voltage NMOS transistor in the substrate self-aligned to the edge of the high voltage NMOS transistor gate region;

forming source and drain regions for the low voltage PMOS transistors by means of creating ion implanted p⁺-regions; and forming source and drain regions for the high voltage and low voltage NMOS transistors by means of creating ion implanted n⁺regions, wherein the source region for the high voltage NMOS transistor is created within the p-doped channel region, wherein:

the step of forming a p-doped channel region for the high voltage NMOS transistor in the substrate self-aligned to the edge of the high voltage NMOS transistor gate region is performed by ion implantation through a mask, said ion implantation being effectuated in a direction, which is inclined at an angle to the normal of the substrate surface, to thereby create said p-doped channel region partly underneath the gate region of the high voltage NMOS transistor;

said isolation area defining said voltage-distributing region, said p-doped channel region, and said source and drain regions for the high voltage NMOS transistor are formed laterally within said n-well region for the high voltage NMOS transistor; and a region extending in said n-well region for the high voltage NMOS transistors from said p-doped channel region to said drain for the high voltage-distributing region has a length, which is set by a length of said isolation area defining said voltage-distributing region and said step of forming a p-doped channel region for the high voltage NMOS transistors.

2. The method as claimed in claim 1 wherein said p-doped channel region for the high voltage NMOS transistor is created by ion implantation of boron, or other p-type dopant.

3. The method as claimed in claim 1 wherein said p-doped channel region for the high voltage NMOS transistor is created by ion implantation at a dose ranging from $10^{12}$ cm$^{-2}$ to $10^{15}$ cm$^{-2}$.

4. The method as claimed in claim 1 wherein said p-doped channel region for the high voltage NMOS transistor is created by ion implantation at an energy between 10 keV and 1000 keV.

5. The method as claimed in claim 1 wherein the angle with which the implantation direction is inclined from normal incidence is within the range of 15–75°.

6. The method as claimed in claim 1 wherein said p-doped channel region for the high voltage NMOS transistor is created by ion implantation at a dose and at an energy such that a controlled performance of the high voltage NMOS transistor is obtained.

7. The method as claimed in claim 1 wherein said p-doped channel region for the high voltage NMOS transistor is created by ion implantation through a mask and at an energy such that a dopant concentration is achieved underneath the gate region of the high voltage NMOS transistor which is at least as high as the dopant concentration outside the edge of the high voltage NMOS transistor gate region.

8. The method as claimed in claim 7 wherein said p-doped channel region for the high voltage NMOS transistor is created such that said channel region has the highest dopant concentration underneath the gate region of the high voltage NMOS transistor.

9. The method as claimed in claim 1 wherein said conducting or semiconducting material, of which the layer forming the gate region is made, is polysilicon.

10. The method as claimed in claim 1 wherein the layer, which forms the gate region, is made thick to prevent the dopant implanted during the step of forming the p-doped channel region for the high voltage NMOS transistor from penetrating through said gate region layer.

11. The method as claimed in claim 1 wherein the layer, which forms the gate region, is patterned using a gate region mask; the mask used for ion implantation to form the p-doped channel region is arranged on top of the gate region mask; and the ion implantation to form the p-doped channel region is performed through both of said masks.

12. The method as claimed in claim 1 wherein said p-doped channel region for the high voltage NMOS transistor is created by ion implantation in plurality of directions, each of which being inclined at said angle to the normal of the substrate surface.

13. The method as claimed in claim 12 wherein said plurality of implantation directions are four; and wherein said directions are symmetrically distributed around the normal of the substrate surface.

14. The method as claimed in claim 12 wherein the high voltage NMOS transistor is symmetric with respect to at least one plane parallel to the formal of the substrate surface.

15. The method as claimed in claim 1 wherein said isolation areas are formed as LOCOS oxide.

16. The method as claimed in claim 1 wherein said isolation areas are formed as shallow trench isolation (STI) areas.

17. The method as claimed in claim 1 wherein the isolation area defining the voltage-distributing region within the high voltage NMOS transistor is a low-doped $n^{31}$ region.

18. The method as claimed in claim 1 further comprising the formation of a high voltage PMOS transistor, wherein
a p-well region for the high voltage PMOS transistor is formed in the substrate simultaneously with the formation of the p-well region for the low voltage NMOS transistor;
an isolation area defining a voltage-distributing region in the high voltage PMOS transistor is formed simultaneously with the formation of said isolation areas;
a gate region for the high voltage PMOS transistor is produced simultaneously as the production of said gate regions for the high voltage NMOS transistor and the low voltage NMOS and PMOS transistors, respectively, whereby the gate region for the high voltage PMOS transistor is formed partly above the isolation area defining the voltage distributing region in the high voltage PMOS transistor; and further comprising;
forming an n-doped channel region for the high voltage PMOS transistor in the substrate self-aligned to the edge of the high voltage PMOS transistor gate region, by means of ion implantation through a mask, said ion implantation being effectuated in a direction, which is inclined at an angle to the normal of the substrate surface, to thereby create said n-doped channel region partly underneath the gate region of the high voltage PMOS transistor; and
forming drain and source regions for the high voltage PMOS transistor by means of creating ion implanted p+regions.

19. The method as claimed in claim 18 wherein the step of forming a p-well region for the high voltage PMOS transistor is preceded by the formation of a large n-doped region for the high voltage PMOS transistor; and
wherein the p-well region for the high voltage PMOS transistor is formed within said n-doped region.

20. An integrated CMOS- or BiCMOS-based circuit comprising at least a high voltage NMOS transistor, a low voltage NMOS transistor and a low voltage PMOS transistor, respectively, wherein said transistors are formed according to the method as claimed in claim 1.

21. In an CMOS or BiCMOS process a method for forming a high voltage PMOS transistor together with a low voltage NMOS transistor and a low voltage PMOS transistor, respectively, comprising the steps of:
providing a semiconductor substrate;
forming an n-well region for the low voltage PMOS transistor in the substrate by means of ion implantation;
forming p-well regions for the high voltage PMOS transistors and the low voltage NMOS transistor in the substrate by means of ion implantation;
forming isolation areas on top of and/or in the substrate to laterally separate the transistors from each other and to define a voltage-distributing region in the high voltage PMOS transistor;
producing gate regions for the high voltage PMOS transistor and the low voltage NMOS and PMOS transistors, respectively, by forming a respective thin gate oxide on the substrate; depositing a layer of a conducting or a semiconducting material thereon; and patterning said layer to form the respective gate regions, whereby the gate region for the high voltage PMOS transistor is formed partly above the isolation area defining the voltage distributing region;
forming an n-doped channel region for the high voltage PMOS transistor in the substrate self-aligned to the edge of the high voltage PMOS transistor gate region;
forming drain and source regions for the high and low voltage PMOS transistors by means of creating ion implanted p$^+$-regions, wherein the source region for the high voltage PMOS transistor is created within the n-doped channel region;
forming drain and source regions for the low voltage NMOS transistor by means of creating ion implanted n$^+$-well regions,
wherein:
the step of forming an n-doped channel region for the high voltage PMOS transistor in the substrate self-aligned to the edge of the high voltage PMOS transistor gate region is performed by ion implantation through a mask, said ion implantation being effectuated in a direction, which is inclined at an angle to the normal of the substrate surface, to thereby create said n-doped channel region partly underneath the gate region of the high voltage PMOS transistor;

said isolation area defining said voltage-distributing region, said p-doped channel region, and said source and drain regions for the high voltage NMOS transistor are formed laterally within said n-well region for the high voltage NMOS transistor; and a region extending in said n-well region for the high voltage NMOS transistors from said p-doped channel region to said drain for the high voltage-distributing region has a length, which is set by a length of said isolation area defining said voltage-distributing region and said step of forming a p-doped channel region for the high voltage NMOS transistors.

22. The method as claimed in claim 21 wherein the step of forming a p-well region for the high voltage PMOS transistor is preceded by the formation of a large n-doped region for the high voltage PMOS transistor; and wherein the p-well region for the high voltage PMOS transistor is formed within said n-doped region.

23. An integrated CMOS- or BiCMOS-based circuit comprising at least a high voltage PMOS transistor, a low voltage NMOS transistor and a low voltage PMOS transistor, respectively, where said transistors are formed according to the method as claimed in claim 21.

24. The method as claimed in claim 1 wherein the respective transistors are high frequency transistors.

25. The method as claimed in claim 1 wherein the respective transistors are radio frequency transistors.

26. The method as claimed in claim 1 wherein said ion implantation is effectuated to set the doping profile of said p-doped channel region without the use of a diffusion step.

27. The method as claimed in claim 21 wherein the respective transistors are high frequency transistors.

28. The method as claimed in claim 21 wherein the respective transistors are radio frequency transistors.

29. The method as claimed in claim 21 wherein said ion implantation is effectuated to set the doping profile of said p-doped channel region without the use of a diffusion step.

* * * * *